United States Patent [19]
Davis et al.

[11] Patent Number: 5,719,435
[45] Date of Patent: Feb. 17, 1998

[54] PROGRAMMING SYSTEM FOR SEMICONDUCTOR DEVICES AND METHOD THEREFOR

[75] Inventors: Benjamin R. Davis, Chandler; Ronald V. DeLong, Mesa, both of Ariz.

[73] Assignee: Motorola, Inc., Schaumburg, Ill.

[21] Appl. No.: 810,101

[22] Filed: Mar. 3, 1997

[51] Int. Cl.⁶ ................................................ H01L 23/495
[52] U.S. Cl. ........................... 257/666; 257/734; 257/692
[58] Field of Search ............................ 257/666, 734, 257/735, 692

[56] References Cited

U.S. PATENT DOCUMENTS

| | | |
|---|---|---|
| 4,471,158 | 9/1984 | Roberts ................................. 257/676 |
| 5,264,729 | 11/1993 | Rostoker et al. . |
| 5,360,992 | 11/1994 | Lowrey et al. . |
| 5,523,617 | 6/1996 | Asanasavest . |

*Primary Examiner*—Mahshid D. Saadat
*Assistant Examiner*—S. V. Clark
*Attorney, Agent, or Firm*—Robert F. Hightower

[57] ABSTRACT

A programming system (25, 30) for a programmable semiconductor package (10, 40) has actuators (27, 37) that force contact between leads (13) and a programming contact (21). The contact provides programmable information to a semiconductor die (16) within the package.

7 Claims, 2 Drawing Sheets

PROGRAMMING SYSTEM FOR SEMICONDUCTOR DEVICES AND METHOD THEREFOR

BACKGROUND OF THE INVENTION

In the past, a variety of techniques have been utilized to provide programming or variable information to semiconductor devices. One such method is to connect a switch to each lead on the semiconductor device, and then set the switch to an open or closed position depending on the information to be provided. One common method of providing such switches is to mount the semiconductor device to a printed circuit board and connect the semiconductor device leads to the switches that are also mounted on the printed circuit board. The switches are manually opened or closed to predetermined positions in order to provide the programming or variable information. One disadvantage of such a technique is that it is easy to inadvertently set a switch to an incorrect position thereby providing incorrect information to the semiconductor device.

Accordingly, it is desirable to have a programming method or programming system that minimizes errors in the variable or program information.

DETAILED DESCRIPTION OF THE DRAWINGS

Figure 1:
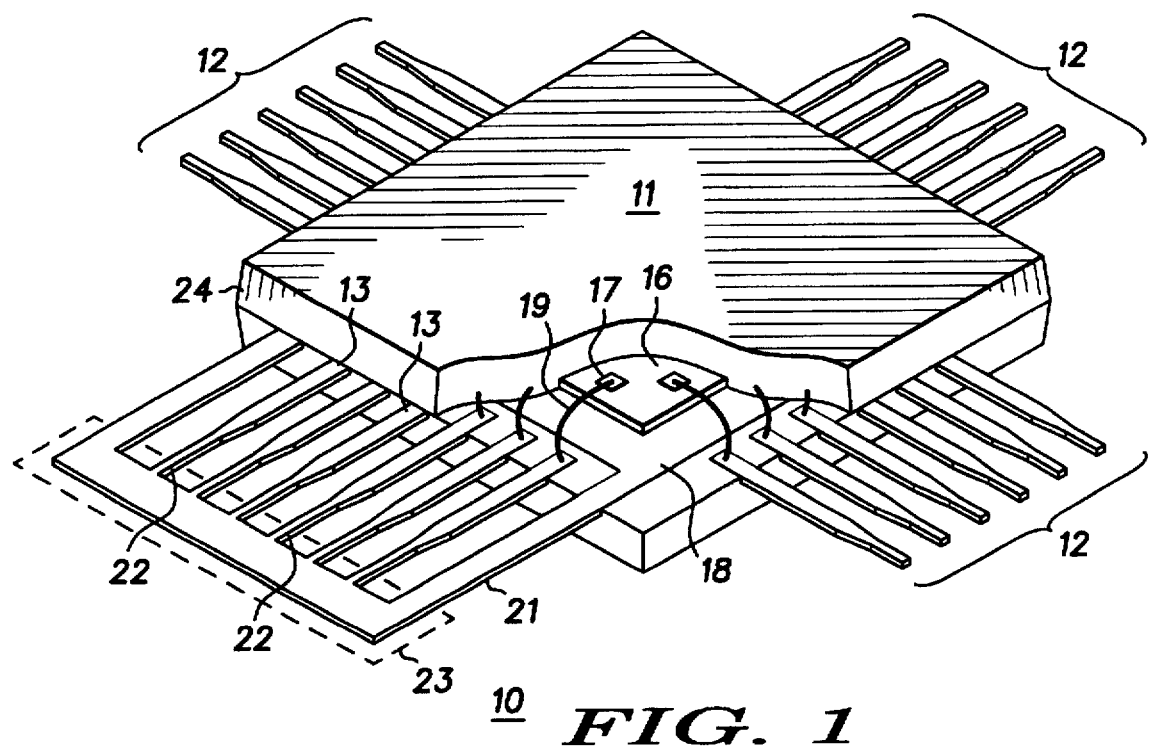
FIG. 1 illustrates a cut-away isometric view of an embodiment of a programmable semiconductor package at a stage of manufacturing in accordance with the present invention.

FIG. 1 illustrates an isometric view of a programmable semiconductor package 10 at a stage of manufacturing. Package 10 includes a semiconductor die 16 that has been attached to a die attach flag 18 that is part of a leadframe using techniques that are well known to those skilled in the semiconductor art. The leadframe (not shown) also holds in place a single lead or a plurality of leads 12 while die 16 is attached to flag 18. Thereafter, leads 12 are electrically connected to die 16, for example by bonding wires 19. Such leadframes and electrical connection techniques are well known to those skilled in the semiconductor art. Package 10 also includes a single programming lead or a plurality of programming leads 13 that are also attached to die 16, for example by bonding wires 17. After die 16 is attached to flag 18 and electrically connected to leads 12 and 13, a body 11 is applied to encase die 16 along with a portion of leads 12 and 13 in order to protect die 16. Such packaging techniques are well know to those skilled in the semiconductor art. For example, body 11 may be a molded plastic body or a ceramic body both of which are well known to those skilled in the semiconductor art. Leads 12 extend from body 11. After forming body 11, leads 12 are excised from the leadframe and the portion of the leadframe holding leads 12 is removed from package 10 using techniques that are well known to those skilled in the semiconductor art. However, the portion of the leadframe holding leads 13 remains attached to package 10. The exterior portion of this remaining portion of the leadframe forms a programming contact 21 that extends from a side 24 of body 11 and is juxtaposed to leads 13. Contact 21 has a first portion 23, shown by a dashed box, that extends perpendicularly to leads 13 and is attached to leads 13 at attachment points 22. Subsequently, leads 13 are disconnected from contact 21 by excising leads 13 at attachment points 22, thereby leaving a gap between the ends of leads 13 and first portion 23.

Figure 2:
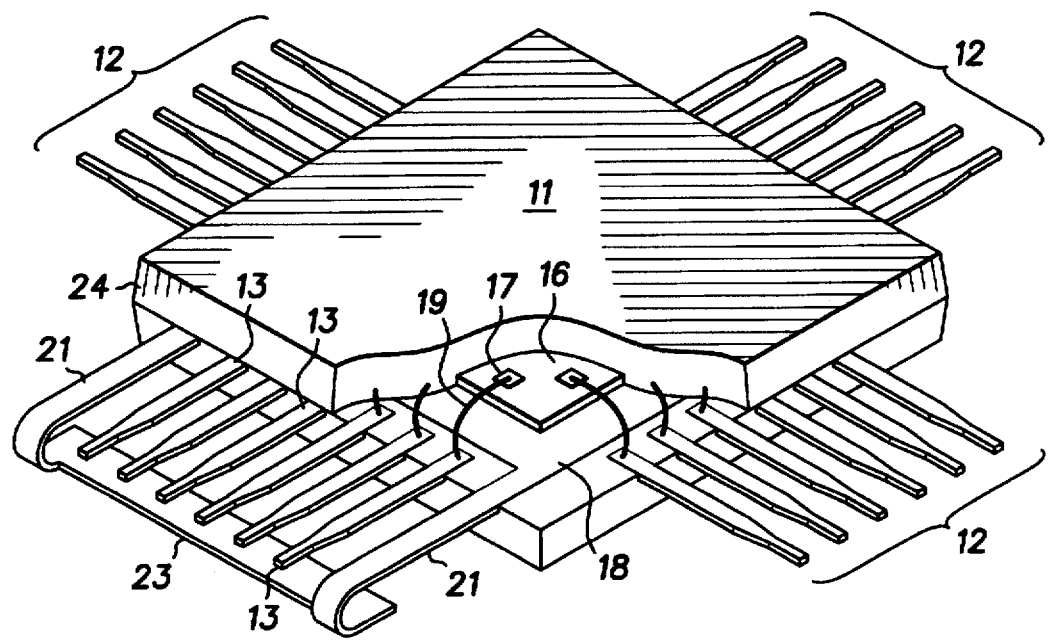
FIG. 2 illustrates a cut-away isometric view of the package of FIG. 1 at a subsequent manufacturing stage in accordance with the present invention.

FIG. 2 illustrates package 10 of FIG. 1 at a subsequent manufacturing stage. The same elements in FIG. 1 and FIG. 2 are represented by the same element numbers. After disconnecting leads 13 from portion 23, first portion 23 of contact 21 is bent or formed to underlie leads 13 and longitudinally traverse leads 13 so that first portion 23 is near leads 13. Typically, there is a separation or space therebetween. Consequently, first portion 23 typically does not contact leads 13 but first portion 23 is near leads 13 so that leads 13 may be movably contacted to first portion 23. For example, leads 13 may be pressed or moved toward portion 23 until making contact therewith. However, due to manufacturing tolerances and other considerations leads 13 may touch portion 23.

Contact 21 is electrically connected to die 16. For example, contact 21 may be connected to flag 18 as shown in FIG. 2, or contact 21 can be attached to other points or voltage sources on die 16 or elsewhere by wirebonds.

Figure 3:
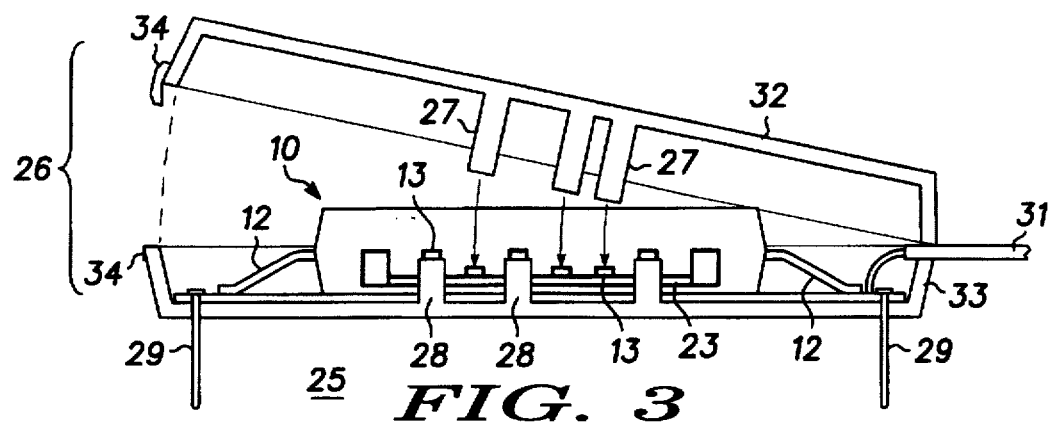
FIG. 3 illustrates a cross-sectional view of a programming system for the semiconductor package of FIG. 2 in accordance with the present invention.

FIG. 3 illustrates a cross-sectional view of a programming system 25 for package 10. Similar elements in FIG. 2 and FIG. 3 are represented by the same element numbers. System 25 includes a housing 26 with package 10 mounted therein. System 25 has programming actuators 27 formed within housing 26 and extending therefrom. Actuators 27 press upon leads 13 and force leads 13 against first portion 23 of contact 21 thereby providing program information to die 16. System 25 also has programming stops 28 within housing 26 and extending therefrom. Stops 28 press leads 13 away from first portion 23 of programming contact 21 thereby insuring no contact between leads 13 and contact 21 thereby providing program information to die 16.

Housing 26 may have a variety of configurations for providing the programming actuators and stops. For example, housing 26 may be formed to have an upper half 32 and a lower half 33 that are hinged together so that housing 26 may be opened and closed, and may be held closed by a catch or latch 34. As top half 32 is closed, actuators 27 thrust against leads 13 forming contact between leads 13 and first portion 23. Additionally, housing 26 can be formed from a variety of materials, for example, housing 26 can be molded plastic and actuators 27 and stops 28 can be integrally formed within housing 26.

Additionally, system 25 can have pins 29 that extend from a bottom portion of housing 26 and are electrically connected to leads 12 of package 10. Housing 25 also can include a cable 31 that enters through a side portion of housing 26 and has wires electrically connected to package 10. Such a cable can be used to connect package 10 to a printed circuit board that is a distance from system 25.

Package 10 and system 25 are not limited by the foregoing description, but can have other configurations. For example, portion 23 can be formed to overlay, instead of underlie, leads 13. Actuators 27 and stops 28 would be reversed to mate therewith. Additionally, leads 13 can be bent into other shapes and portion 23 can be formed sufficiently to provide contact therewith.

Figure 4:
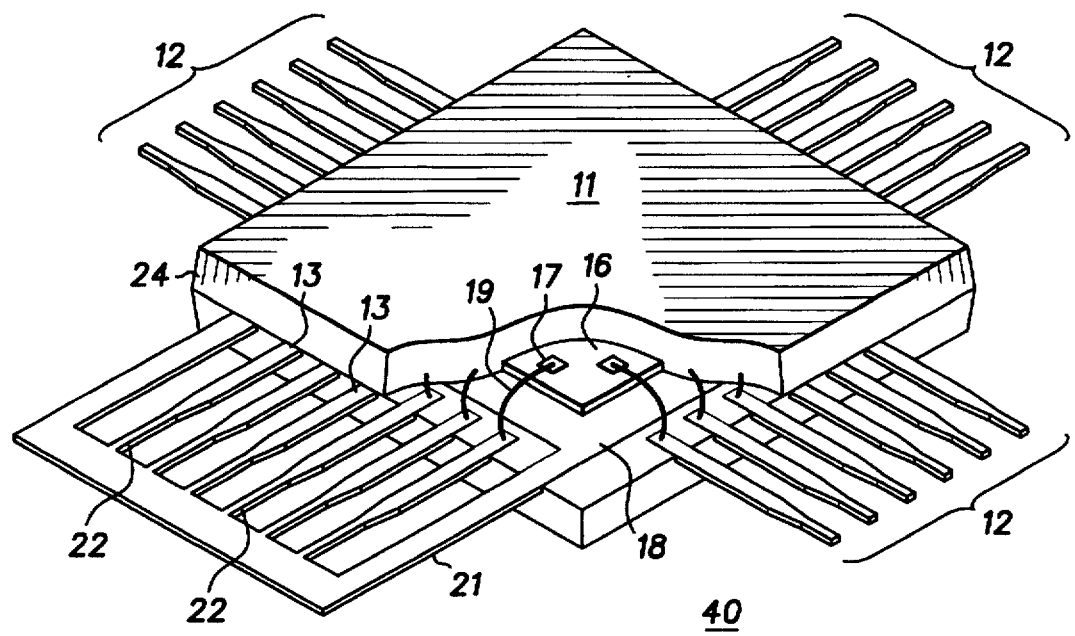
FIG. 4 an alternate embodiment of the semiconductor package of FIG. 2 in accordance with the present invention.

FIG. 4 illustrates a programmable semiconductor package 40 that is an alternate embodiment of package 10 shown in FIG. 2. Similar elements in FIG. 2 and FIG. 4 have the same element numbers. As shown in FIG. 4, leads 13 remain attached to contact 21 at attachment points 22. At this point, leads 13 all provide the same programming information to semiconductor die 16.

Figure 5:
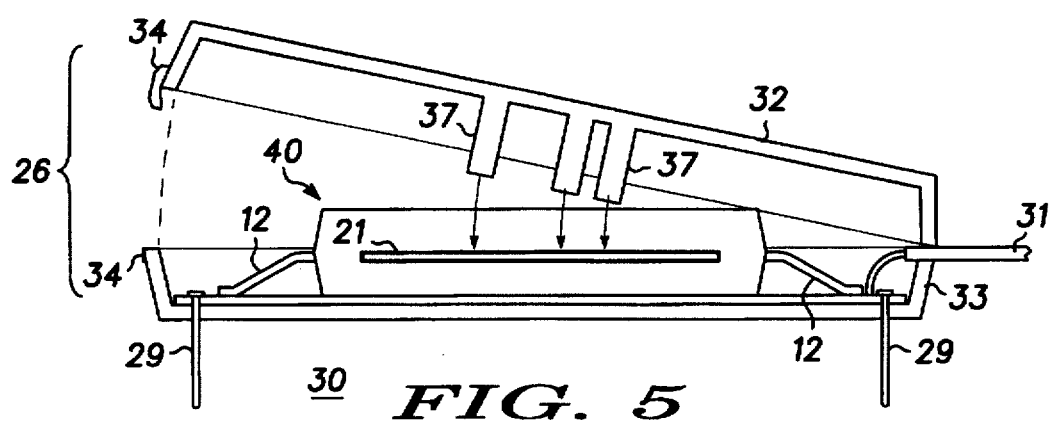
FIG. 5 illustrates a cross-sectional view of a programming system for the package of FIG. 4 in accordance with the present invention.

FIG. 5 illustrates a cross-sectional view of a programming system 30 for package 40. Similar elements in FIGS. 3, 4, and 5 are represented by the same element numbers. System 30 includes housing 26 and has package 40 mounted therein. Housing 26 includes programming actuators 37 formed therein and extending therefrom. Actuators 37 selectively sever attachment points 22 thereby breaking contact between leads 13 and programming contact 21. That is the presence of an actuator 37 severs a contact and the absence of an actuator 37 does not sever, thus it is selective. By selectively severing the attachment between leads 13 and contact 21, programming information is provided to semiconductor die 16. The programming system can be constructed similarly to system 25 shown in FIG. 3, however, programming actuators 37 must overlay attachment points 22 in order to sever attachment points 22.

In an alternate embodiment, actuators 27 can be omitted and replaced with openings through housing 30. During manufacturing, a machine can insert actuators or pins through the openings to selectively sever the attachments, then remove the pins.

Accordingly, there has been provided a novel programmable semiconductor package and programming system therefor and a method of providing variable information to a semiconductor device. Additionally, forming program actuators within the housing of the programming system insures that the same programming information is always provided by the housing to the package thereby eliminating programming errors.

We claim:

1. A programming system for a semiconductor package comprising:

a body encasing a semiconductor die, the body having a side;

a programming lead extending from the body wherein the programming lead is electrically coupled to the semiconductor die; and a programming contact extending from the side of the body wherein a first portion of the programming contact is near the programming lead for movably contacting the programming lead and the first portion of the programming contact to make electrical contact therebetween.

2. The programming system of claim 1 wherein the programming contact is electrically coupled to the semiconductor die.

3. The programming system of claim 1 wherein the programming lead includes a plurality of programming leads.

4. The programming system of claim 3 further including a programming stop that prevents at least one programming lead of the plurality of programming leads from contacting the programming contact.

5. The programming system of claim 1 wherein the programming contact is an exterior support of a leadframe, the exterior support having a second portion extending from the body and juxtaposed to the programming lead and wherein the first portion extends from the second portion transversely to the programming lead.

6. The programming system of claim 1 further including a housing wherein the semiconductor package is mounted within the housing, the housing having a programming actuator that forces the program lead against the programming contact.

7. The programming system of claim 6 wherein the housing is molded plastic and the programming actuator is an integrally molded portion of the housing.

* * * * *